Jan. 17, 1961
T. P. SYLVAN
2,968,770
UNIJUNCTION TRANSISTOR CIRCUIT
Filed Nov. 19, 1958
FIG. 1.
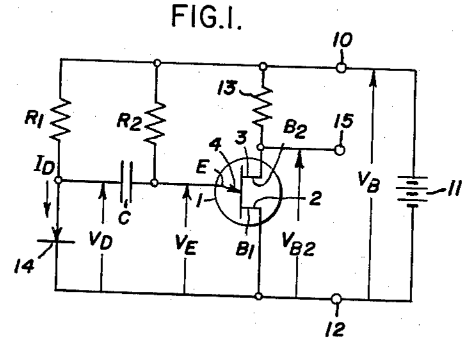
FIG. 3A.
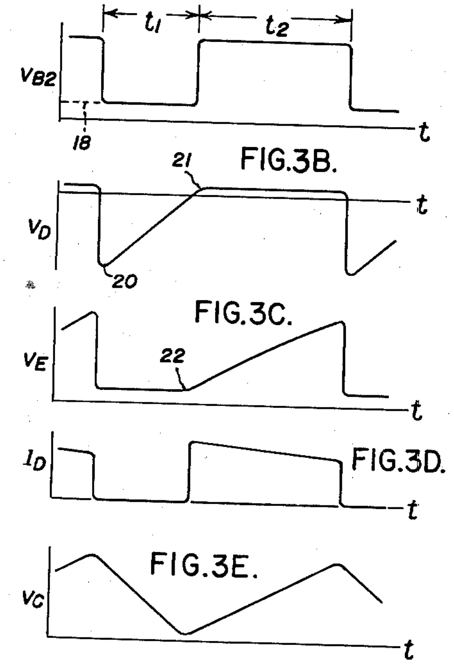
FIG. 3B. FIG. 3C. FIG. 3D. FIG. 3E.
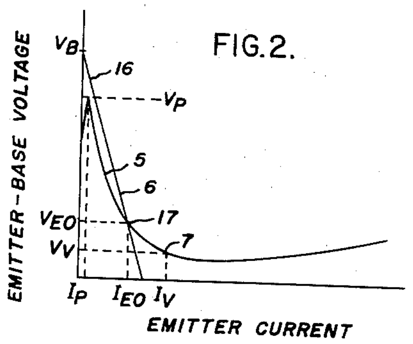
FIG. 2.
FIG. 4.
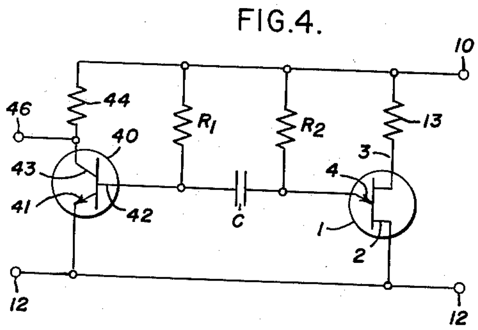
FIG. 6.
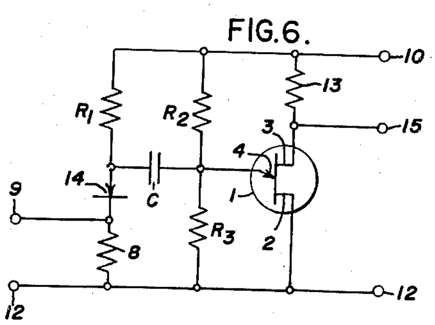
FIG. 5.
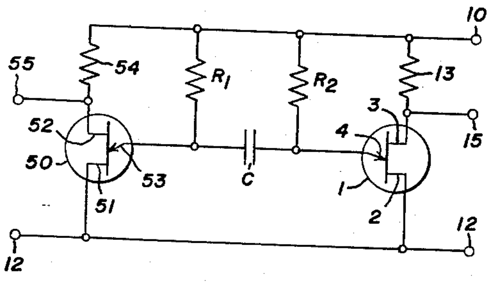
FIG. 7.
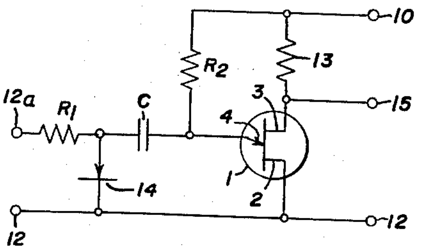
INVENTOR:
TAGE P. SYLVAN,
BY Julius J. Zaskalicky
HIS ATTORNEY.

United States Patent Office 2,968,770

Patented Jan. 17, 1961

2,968,770

UNIJUNCTION TRANSISTOR CIRCUIT

Tage Peter Sylvan, Syracuse, N.Y., assignor to General Electric Company, a corporation of New York Filed Nov. 19, 1958, Ser. No. 778,553

7 Claims. (Cl. 331—111)

This invention relates in general to transistor circuits and more particularly relates to unjunction transistor circuits incorporating devices of the kind described in U.S. Patent 2,769,826, Lesk, assigned to the assignee of the present invention.

The above-mentioned patent discloses a three-terminal semiconductor device with a single rectifying junction disposed intermediately of spaced bilaterally conductive electrodes. As more fully pointed out in the patent, such devices have negative resistance characteristics which are useful in wave generation circuits. Some of the various circuits utilizing characteristics of this three-terminal device are described and claimed in U.S. Patent 2,792,599, Mathis, and Patent 2,801,340, Keonjian and Suran, both assigned to the assignee of the present invention.

It is an object of this invention to provide unijunction transistor wave generating circuits which are reliable and stable in operation, yet which are formed of a minimum of circuit elements.

Another object of this invention is to provide unijunction transistor wave generation circuits, the outputs of which are less dependent than such prior art circuits on slight variations in the individual characteristics of the unijunction transistors themselves.

It is a further object of the present invention to provide unijunction transistor multivibrator circuits, the periods of a cycle of which are susceptible to variation over a greater range than prior art circuits.

The features of my invention which I believe to be novel are set forth with particularity in the appended claims. My invention itself, however, both as to its organization and method of operation, together with further objects and advantages thereof, may best be understood by reference to the following description taken in connection with the accompanying drawings, in which:

Figure 1 is a schematic diagram of a wave generation circuit embodying the present invention;

Figure 2 is a diagram showing one of the operating characteristics of the semiconductor device utilized in the circuit of Figure 1;

Figures 3A through 3E show a family of graphs of the voltages and currents at various points in the circuit of Figure 1 and are useful in explaining the operation of that circuit;

Figures 4 through 7 show other embodiments of the present invention.

A unijunction transistor such as the device 1 shown in Figure 1 comprises a bar of semiconductive material of one conductivity type which may be N-type or P-type, but for the purposes of explanation it will be assumed that the bar is of N-type, to which are made spaced bilaterally conductive or ohmic contacts 2 and 3 referred to as base No. 1 and base No. 2. Intermediate the ends of the bar a rectifying contact, referred to as emitter 4, is made. The rectifying contact advantageously may be formed by fusing impurities into the bar of opposite conductivity type, thereby creating a region of opposite conductivity type therein which forms a rectifying junction with the bar.

In this specification the negative terminal of a unijunction transistor or a unilaterally conducting device is that terminal which must be negative with respect to the other terminal forming a unilaterally conducting element therewith in order to permit current to flow from one terminal to the other.

Refer now particularly to Figure 2 and assume that an operating potential has been applied across the base electrodes of the unijunction transistor 1 with the base 2 negative with respect to the base 3 and a potential of gradually increasing magnitude is applied between the emitter 4 and the base 2. Normally the emitter 4 would be back-biased and essentially no current would flow from emitter 4 to base 2. As the potential on the emitter 4 is increased, a point $V_p$ is reached on the graph of Figure 2 at which the emitter becomes positive with respect to the potential existing in the bar adjacent the emitter. At this point current starts to flow from the emitter 4 to the base 2. The flow of current in that portion of the bar between the emitter 4 and the base 2 causes a lowering of the resistance therein, thereby permitting a further increase in current which in turn causes a still further decrease in resistance. Accordingly, it is seen that the applied voltage required between emitter and base 2 to sustain a particular current becomes increasingly less, until a point 7, referred to as the "valley" point, is reached at which a further increase in current does not cause a further reduction in resistance. Beyond this point an increase in voltage causes current to increase.

Referring now particularly to Figure 1, the emitter 4 of device 1 is connected through a charging resistance $R_2$ to the positive terminal 10 of a source of operating potential 11, the negative terminal 12 of which is connected to base electrode 2. Base electrode 3 is connected through a load resistance 13 to terminal 10. A capacitance C and a unilaterally conducting device 14 are connected in series circuit in the order named between the emitter 4 and the base electrode 2 with the negative terminal of the unilaterally conducting device connected to the negative terminal of the unijunction transistor. Another charging resistance $R_1$ is connected between the junction of unilaterally conducting device 14 and capacitor C, and terminal 10. Output is derived from the circuit between terminal 12 and terminal 15 connected to the base electrode 3.

The conditions which must be met to permit oscillation of the circuit of Figure 1 are the following: The current supplied through $R_2$ to the emitter must be greater than the peak point current on the graph of Figure 2. Mathematically expressed:

$$\frac{V_B-V_P}{R_2}>I_P \qquad (1)$$

where $V_B$=supply voltage of source 11
$I_P$ = peak point current
$V_P$ = peak point voltage The load line 16 in Figure 2 formed by $R_2$ and $V_B$ must fall to the left of the valley point of the emitter characteristic curve, that is, in the negative resistance region, or expressed mathematically:

$$\frac{V_B-V_V}{R_2}<I_V \qquad (2)$$

where $V_V$ is equal to the "valley" point voltage and $I_V$ is "valley" point current.

The operation of the circuit of Figure 1 will be explained with reference to Figures 3A through 3E. Assuming that the emitter 4 of the unijunction transistor 1 is initially reversely biased, that is, non-conducting, capacitor C will charge through resistance $R_2$ and diode 14 toward the potential level of source 11. When the potential at the emitter reaches $V_P$, the unijunction transistor will conduct. Current will flow through $R_2$ to the emitter, thence through the device to base electrode 2. The current will increase for reasons mentioned above and the voltage between emitter 4 and base electrode 2 will fall to point 17 on load line 16. The voltage on base electrode 3 will drop to a level 18 on the graph of Figure 3A. The voltage at the junction of capacitor C and diode 14 will drop to a point 20 as shown on the graph of Figure 3B, thereby rendering the unilaterally conducting device 14 non-conductive. Thereafter, capacitor C charges through resistance $R_1$ to the potential of terminal 10 until a point 21 on the graph of Figure 3B is reached, at which time the unilaterally conducting device 14 again becomes conductive, thereby shunting the current flowing in the emitter into the capacitance. As the impedance of emitter-base circuit of the unijunction transistor is dependent on current, this impedance very rapidly reverts to its non-conducting value as a result of the shunting of current into the capacitance. Accordingly, capacitor C charges from point 22 in Figure 3C until it again becomes equal to $V_P$ at which time the afore-described cycle repeats. The current flow into the diode is represented by the graph of Figure 3D, and the voltage across capacitor C is represented by the graph of Figure 3E.

The periods $t_1$ and $t_2$ of the cycle of Figure 3A are given by the equations:

$$t_1=R_2C_{\ln}\left[\frac{V_B-V_{EO}}{V_B-V_P}\right] \quad (3)$$

$$t_2=R_1C_{\ln}\left[\frac{V_B-V_P-V_{EO}}{V_B}\right] \quad (4)$$

where $V_{EO}$ is the emitter voltage corresponding to current $I_{EO}$ at point 17. At this point emitter current $I_{EO}$ is given by the relationship $$I_{EO}=\frac{V_B}{R_1}+\frac{V_B-V_{EO}}{R_2} \quad (5)$$

or if $V_{EO}$ is small compared to $V_B$, then $$I_{EO}\cong V_B\left[\frac{1}{R_1}+\frac{1}{R_2}\right] \quad (6)$$

One of the advantages of the present circuit over a circuit such as shown in Figure 1 of the aforementioned Keonjian et al. Patent 2,801,340 is that fewer conditions are imposed on the capacitance charging and discharging resistances $R_2$ and $R_1$, respectively, for oscillation. In the aforementioned patent, the condition that $$\frac{R_{17}V_B}{R_{17}+R_{19}}>V_P$$

must be met, otherwise the circuit will not oscillate. This limits the choice of resistances which in turn limits the range of "off" and "on" times of the circuits. Furthermore, with such a requirement, the capacitance 20 charges, not to the source voltage $V_B$, but to the voltage $$\frac{R_{17}V_B}{R_{17}+R_{19}}$$

Accordingly, if the peak value of voltage $V_P$ varies from one device to another, appreciable change in the "on" and "off" periods results. Accordingly, it is seen that the present circuit enables greater flexibility in control over the periods $t_1$ and $t_2$ of the output to be obtained over prior art circuits. Or expressed in other words, the requirements on the components of the present circuit are not critical. Oscillation will occur for an extremely wide range of values of $R_1$, $R_2$ and C. The period of either part of the cycle may be varied independently over a wide range without restricting the period which can be achieved in the other part of the cycle.

Figures 4 through 7 show other embodiments of the present invention. Elements of these figures corresponding to the elements of Figure 1 have been given the same literal or numerical designations.

In Figure 4 the base-emitter circuit of an NPN transistor 40 has replaced the unilaterally conducting device 14 of Figure 1. The transistor 40, which comprises emitter 41, base 42 and collector 43, in addition enables an amplified and buffered output to be obtained from the unijunction transistor circuit. In this figure, the emitter 41 is connected to terminal 12. Base 42 is connetced to the junction of capacitance C and resistance $R_1$. Collector 43 is connected to output terminal 46 and also to one end of output resistance 44, the other end of which is connected to terminal 10. Graph 3D illustrates the character of the base current flowing into base 42. Such current is ideal in that the base current to the transistor is nearly constant and the transistor does not have to take high surge currents from the capacitor C. The graph of Figure 3B is representative of the character of the voltage applied to the base 42. Note that reverse bias is applied to the transistor, thereby achieving positive turn-off. In this figure, as the load is effectively isolated from the timing circuits, variations in load have negligible effect on the timing periods.

Figure 5 shows a symmetrical multivibrator using two unijunction transistors. In this figure the emitter-base circuit of a unijunction transistor has replaced the unilaterally conducting device 14 of Figure 1. The unijunction transistor 50, which comprises base 51, base 52 and emitter 53, enables an additional output inverse in phase to the output of device 1 to be obtained. In this figure base 51 is connected to terminal 12, base 52 is connected through load resistance 54 to terminal 10 and also directly connected to output terminal 55. This circuit also enables sawtooth outputs with respect to ground which are inverse in phase to be obtained at emitters 4 and 53.

Figure 6 shows a one-shot multivibrator circuit. Resistance $R_3$ connected between emitter 4 and terminal 12 provides a bias in emitter 4 which is slightly less than the peak voltage $V_P$ of the emitter. The unijunction transistor is triggered conductive by means of a positive triggering voltage applied across resistance 8 connected between terminal 12 and terminal 9 which is connected to the negative electrode of diode 14. The circuit may also be triggered conductive by application of a suitable negative pulse at base electrode 3 to render the unijunction transistor conductive.

Figure 7 shows another one-shot multivibrator circuit. The resistance $R_1$ is returned to terminal 12$a$, a negative potential point which biases the unilaterally conducting device non-conducting. The emitter of the unijunction is normally conducting. The emitter is turned off by raising the potential of terminal 12$a$ to render unilaterally conducting device 14 conductive.

In the circuits of Figures 1, 6 and 7, the "on" and "off" periods may be made substantially independent of the characteristics of the unijunction transistor by the provision of a zener diode, such as disclosed in Patent 2,714,702, or other equivalent voltage regulating device for the unilaterally conducting device 14. When such provision is made, the potential at the junction of the diode 14 and capacitor C drops to a level (point 20 of Figure 3B) which is fixed and determined by the reverse characteristics of the zener diode, and is independent of unijunction transistor characteristics. With such a circuit, it is readily apparent that very precise control of the period of the multivibrator is obtained.

While I have shown a particular embodiment of my invention, it will be understood, of course, that I do not wish to be limited thereto, since many modifications may be made, and I therefore contemplate by the appended claims to cover any such modifications as fall within the true spirit and scope of my invention.

What I claim as new and desire to secure by Letters Patent of the United States is:

1. A wave generating circuit comprising a unijunction transistor having a first base electrode, a second base electrode and an emitter electrode, a first impedance connected in circuit between said emitter and said second base electrode, a capacitor and a unilaterally conducting device connected in series circuit between said emitter and said first base electrode with like polarity electrodes common and said capacitor connected to said emitter, and a second impedance having one end connected to the connection common to said unilaterally conducting device and said capacitance and the other end connected to the end of said first impedance remote from said emitter.

2. A wave generating circuit comprising a unijunction transistor having a first base electrode, a second base electrode and an emitter electrode, a first impedance connected in circuit between said emitter and said second base electrode, a capacitance, a unilaterally conducting device and a second impedance connected in series circuit between said emitter and said first base electrode with said second impedance connecting electrodes of said unilaterally conducting device and said unijunction transistor of like polarity and said capacitor connected to said emitter, a third impedance having one end connected to the connection common to said unilaterally conducting device and said capacitance and the other end connected to the end of said first impedance remote from said emitter, means for applying a triggering pulse across said second impedance, and means for deriving an output across said base electrodes.

3. A wave generating circuit comprising a unijunction transistor having a first base electrode, a second base electrode and an emitter electrode, a first charging resistance and a load impedance connected in the order named between said emitter and said second base electrode, a capacitor and a unilaterally conducting device connected in series circuit between said emitter and said first base electrode with like polarity electrodes common and said capacitor connected to said emitter, and a second resistance having one end connected to the connection common to said unilaterally conducting device and said capacitance, and the other end connected to the junction of said first charging resistance and said load impedance, and means for applying a unidirectional operating potential between said first base electrode and the junction of said load impedance and charging resistance.

4. A wave generating circuit comprising a unijunction transistor having a first base electrode, a second base electrode and an emitter electrode, a first impedance connected in circuit between said emitter and said second base electrode, a capacitor and a zener diode connected in series circuit between said emitter and said first base electrode with like polarity electrodes common and said capacitor connected to said emitter, and a second impedance having one end connected to the connection common to said diode and said capacitance and the other end connected to the end of said first impedance remote from said emitter.

5. A wave generating circuit comprising a unijunction transistor having a first base electrode, a second base electrode and an emitter electrode, a first impedance connected in circuit between said emitter and said second base electrode, a capacitor and a unilaterally conducting device connected in series circuit between said emitter and said first base electrode with like polarity electrodes common and said capacitor connected to said emitter, and a second impedance having one end connected to the connection common to said unilaterally conducting device and said capacitance and the other end connected to a source of variable biasing potential, and means for deriving an output across said base electrodes.

6. A wave generating circuit comprising a unijunction transistor having a first base electrode, a second base electrode and an emitter electrode, another transistor having an emitter, base and collector electrodes, a first impedance means connected in circuit between the emitter of said unijunction transistor and said second base electrode, a capacitor and the emitter-base circuit of said other transistor connected in series in the order named between the emitter of said unijunction transistor and said first base electrode with like polarity electrodes common, a second impedance having one end connected to the connection common to said other transistor and said capacitance and the other end connected to the end of said first impedance remote from the emitter of said unijunction transistor.

7. A wave generating circuit comprising a pair of unijunction transistors each having a first base electrode, a second base electrode and an emitter electrode, a pair of charging impedances, a pair of load impedances, one of said charging impedances connected in circuit with one of said load impedances between the emitter and second base of one of said transistors, the other of said charging impedances connected in circuit with the other of said load impedances between the emitter and second base of the other of said unijunction transistors, the first base electrode of said unijunction transistors of the same kind being connected together, the emitters of said transistors being connected together by a capacitor, and means for applying operating potential between the junctions of said charging and load impedances and said first base electrodes.

References Cited in the file of this patent

UNITED STATES PATENTS

| | | |
|---|---|---|
| 2,802,117 | Mathis et al. | Aug. 6, 1957 |
| 2,876,355 | Suran | Mar. 3, 1958 |